(12) United States Patent
Matsui et al.

(10) Patent No.: US 10,121,677 B2
(45) Date of Patent: Nov. 6, 2018

(54) MANUFACTURING METHOD OF SEMICONDUCTOR DEVICE

(71) Applicant: TOSHIBA MEMORY CORPORATION, Tokyo (JP)

(72) Inventors: Yukiteru Matsui, Aichi (JP); Takahiko Kawasaki, Aichi (JP); Akifumi Gawase, Mie (JP); Kenji Iwade, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 14/989,279

(22) Filed: Jan. 6, 2016

(65) Prior Publication Data

US 2016/0322231 A1  Nov. 3, 2016

(30) Foreign Application Priority Data

Apr. 28, 2015  (JP) .................................. 2015-091948

(51) Int. Cl.
| | |
|---|---|
| *H01L 21/321* | (2006.01) |
| *H01L 21/768* | (2006.01) |
| *B24B 37/04* | (2012.01) |
| *H01L 21/306* | (2006.01) |
| *B24B 1/00* | (2006.01) |
| *H01L 21/3105* | (2006.01) |

(52) U.S. Cl.
CPC ............ *H01L 21/3212* (2013.01); *B24B 1/00* (2013.01); *B24B 37/044* (2013.01); *H01L 21/30625* (2013.01); *H01L 21/31053* (2013.01); *H01L 21/7684* (2013.01); *H01L 21/76819* (2013.01)

(58) Field of Classification Search
None
See application file for complete search history.

(56) References Cited

U.S. PATENT DOCUMENTS

| | | | | |
|---|---|---|---|---|
| 5,540,811 A | * | 7/1996 | Morita | .............. H01L 21/76819 |
| | | | | 257/E21.548 |
| 6,528,389 B1 | * | 3/2003 | Allman | ............. H01L 21/31053 |
| | | | | 257/E21.244 |
| 7,101,801 B2 | | 9/2006 | Ono et al. | |
| 7,829,406 B2 | | 11/2010 | Doi et al. | |

(Continued)

FOREIGN PATENT DOCUMENTS

| | | |
|---|---|---|
| JP | 6-295908 | 10/1994 |
| JP | H7-94453 A | 4/1995 |

(Continued)

*Primary Examiner* — Jiong-Ping Lu
(74) *Attorney, Agent, or Firm* — Finnegan, Henderson, Farabow, Garrett & Dunner, L.L.P.

(57) ABSTRACT

In accordance with an embodiment, a manufacturing method of a semiconductor device includes forming, on a substrate, protruding portions with first films on the surfaces thereof, respectively, forming a second film different from the first films so as to fill a depressed portion between the protruding portions and to cover the protruding portions, processing in such a manner that the top surface of the second film on the depressed portion is higher than the top surface of the second film on the protruding portions after forming the second film to cover the protruding portions, and polishing the second film on the depressed and protruding portions to expose the first films.

10 Claims, 2 Drawing Sheets

(56) References Cited

U.S. PATENT DOCUMENTS

2004/0152316 A1\* 8/2004 Ono .................. C09G 1/02
 438/689
2015/0284593 A1\* 10/2015 Wang ................. C09G 1/02
 438/693

FOREIGN PATENT DOCUMENTS

| JP | 10-50821 | 2/1998 |
| JP | 10-270444 | 10/1998 |
| JP | 2000-36533 | 2/2000 |
| JP | 2009-71062 | 4/2009 |

\* cited by examiner

MANUFACTURING METHOD OF SEMICONDUCTOR DEVICE

CROSS REFERENCE TO RELATED APPLICATIONS

This application is based upon and claims the benefit of priority from the prior Japanese Patent Application No. 2015-091948, filed on Apr. 28, 2015, the entire contents of which are incorporated herein by reference.

FIELD

Embodiments described herein relate generally to a manufacturing method of a semiconductor device.

BACKGROUND

A chemical mechanical polishing (hereinafter briefly referred to as "CMP") technique is a flattening technique used in a manufacturing process of a semiconductor device, and requires improvements in, for example, in-plane uniformity and flatness, and also requires productivity improvements such as the increase of throughput and cost reduction.

Recently, not only further miniaturization but also the introduction of new structures has been carried on for higher capacity and lower power consumption. As a result, the following problems have arisen: the increase in area and steps to be flattened makes flattening difficult, and the increase of the thickness of a layer to be polished increases polishing time and thus deteriorates productivity.

DETAILED DESCRIPTION

Figure 1:
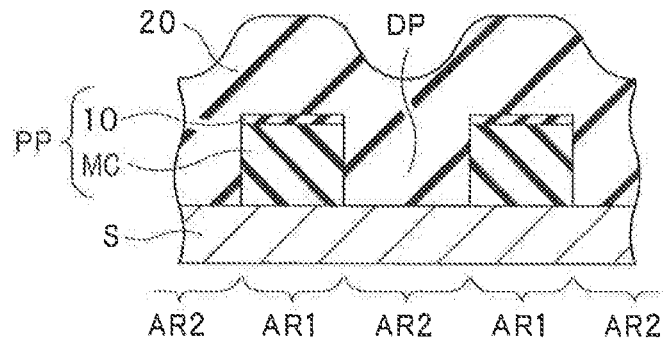
FIG. 1 to FIG. 6 are examples of schematic sectional views illustrating a manufacturing method of a semiconductor device according to one embodiment.

In accordance with an embodiment, a manufacturing method of a semiconductor device includes forming, on a substrate, protruding portions with first films on the surfaces thereof, respectively, forming a second film different from the first films so as to fill a depressed portion between the protruding portions and to cover the protruding portions, processing in such a manner that the top surface of the second film on the depressed portion is higher than the top surface of the second film on the protruding portions after forming the second film to cover the protruding portions, and polishing the second film on the depressed and protruding portions to expose the first films.

Embodiments will now be explained with reference to the accompanying drawings. Like components are provided with like reference signs throughout the drawings and repeated descriptions thereof are appropriately omitted. It is to be noted that the accompanying drawings illustrate the invention and assist in the understanding of the illustration and that the shapes, dimensions, and ratios and so on in each of the drawings may be different in some parts from those in an actual apparatus.

In the specification of the present application, "stacking" not only includes stacking layers in contact with each other but also includes staking layers with another layer interposed in between, "Providing on" not only includes providing a layer in direct contact with a layer but also includes providing a layer on a layer with another layer interposed therebetween. Moreover, terms indicating directions such as "upper" and "lower" in the explanation show relative directions when a wiring formation side in a given layer on a later-described substrate is set as the top. Therefore, the directions may be different from actual directions based on gravitational acceleration directions.

FIG. 1 to FIG. 6 are examples of schematic sectional views illustrating a manufacturing method of a semiconductor device according to one embodiment. The present embodiment shows by way of example a method of flattening an interlayer insulating film formed on a substrate on which memory cells are provided in a manufacturing process of a semiconductor memory. However, the present embodiment is applicable to the manufacture of not only the semiconductor memory but also semiconductor devices in general such as a high-speed logic LSI, a system LSI, and a memory-logic merged LSI.

First, a stack MC (see FIG. 1) and a CMP, first stopper film 10 (see FIG. 1) to be memory cells are formed in a cell region of a substrate.

More specifically, films such as silicon nitride (SiN)/silicon oxide ($SiO_2$) or polysilicon (poly-Si)/silicon oxide ($SiO_2$) are sequentially formed on a substrate S (see FIG. 1), a silicon nitride (SiN) film 10 (see FIG. 1) is then formed on the uppermost silicon oxide ($SiO_2$). Furthermore, these stacked films are selectively removed by patterning that uses a photoresist, whereby a protruding portion PP (see FIG. 1) including the stack MC (see FIG. 1) and the CMP first stopper film 10 is formed in areas AR1 (see FIG. 1). As a result, depressed portions DP (see FIG. 1) are formed in an area AR2 between the areas AR1 and also in a peripheral area AR2 (see FIG. 1). Each of the depressed portions DP here has a stepped shape or a simple depressed shape.

In the present embodiment, the space of the protruding portion PP and the depressed portion DP ranges from 2 to 4 mm in length, and the step of the depressed portion is 3 μm or more in height, which provides a high-step and large-area pattern. In the present embodiment, the CMP first stopper film 10 corresponds to, for example, a first film.

As shown in FIG. 1, chemical vapor deposition (CVD) or coating is then used to form a silicon oxide ($SiO_2$) film 20 of about 4 μm in thickness on the entire surface as an interlayer insulating film so as to fill the depressed portion DP and then cover even the protruding portion PP. In the present embodiment, the silicon oxide ($SiO_2$) corresponds to, for example, a first material, and the silicon oxide ($SiO_2$) film 20 corresponds to, for example, a second film.

Figure 2:
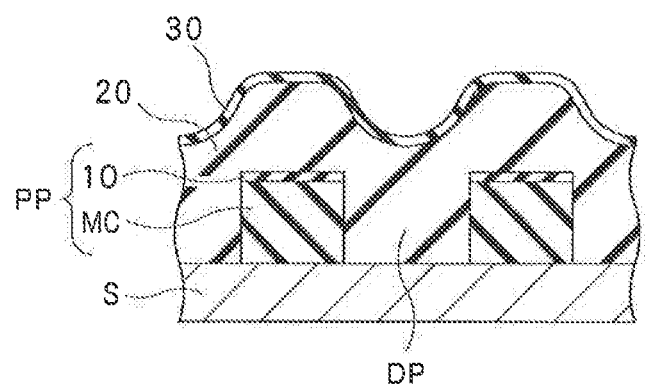

As shown in FIG. 2, a silicon nitride (SiN) film lower in polishing rate than the silicon oxide ($SiO_2$) film 20 is then formed on the silicon oxide ($SiO_2$) film 20 at a thickness of, for example, about 10 nm, thus a second CMP stopper film 30 is formed. In the present embodiment, the silicon nitride (SiN) corresponds to, for example, a second material, and the second CMP stopper film 30 corresponds to, for example, a third film.

Figure 3:
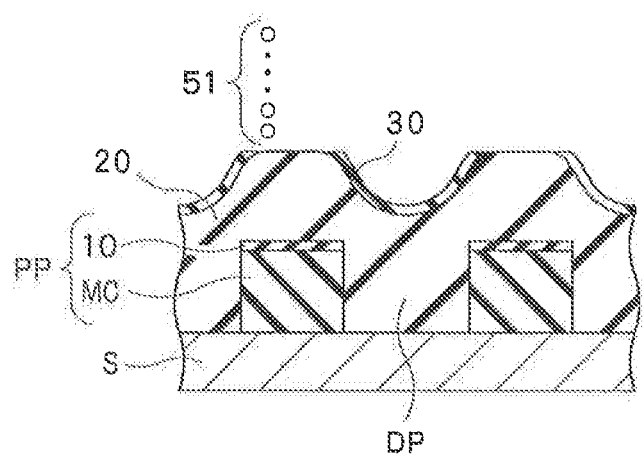

As shown in FIG. 3, the second CMP stopper film 30 on the protruding portion PP is then selectively removed by CMP. As a result, the silicon oxide ($SiO_2$) film 20 on the protruding portion PP is exposed while the silicon oxide ($SiO_2$) film 20 on the depressed portion DP remains covered with the second CMP stopper film 30. As slurry, a cerium oxide slurry 51 can be used, for example. In the polishing shown in FIG. 3, the cerium oxide slurry 51 is used to polish the silicon oxide ($SiO_2$) film 20 at a rate of 450 nm per minute and to polish the second CMP stopper film 30 at a rate of 100 nm per minute. In the present embodiment, the cerium oxide slurry 51 corresponds to, for example, a first polishing agent.

Figure 4:
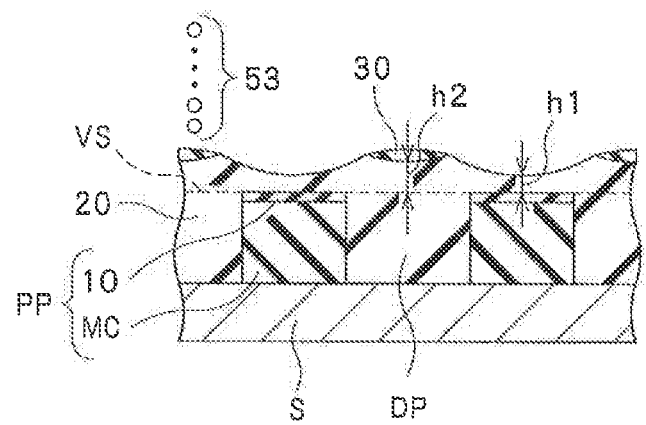

As shown in FIG. 4, the silicon oxide ($SiO_2$) film 20 on the protruding portion PP is then selectively removed by CMP for flattening, and the flattening is stopped at the second CMP stopper film 30 on the depressed portion DP. In this instance, for example, a slurry 53 in which an interfacial active agent (e.g. polycarboxylic acid ammonium salt) is added to cerium oxide is used as a slurry.

The interfacial active agent selectively adsorbs the second CMP stopper film 30, so that the polishing rate of the silicon oxide ($SiO_2$) film 20 is 400 nm per minute, whereas the polishing rate of the second CMP stopper film 30 is 5 nm per minute. Thus, while the residual second CMP stopper film 30 on the depressed portion DP is protected, the silicon oxide ($SiO_2$) film 20 on the protruding portion PP can be selectively polished.

In the CMP shown in FIG. 4, the silicon oxide ($SiO_2$) film 20 on the protruding portion PP is reduced in thickness to have a dishing shape due to overpolishing. That is, the thickness of the silicon oxide ($SiO_2$) film 20 is reduced in accordance with the distance from the circumferential edge of the second CMP stopper film 30.

In this instance, if a virtual surface that connects the top surfaces (the surfaces opposite to the side of the substrate 5) of the CMP first stopper films 10 is VS, a distance (Le, height from the virtual surface VS to the lowermost surface of the second CMP stopper film 30) h2 between the lowermost surface (the surface closest to the substrate 5) of the second CMP stopper film 30 on the depressed portion DP and the virtual surface VS is greater than a thickness h1 of the thinnest part of the silicon oxide ($SiO_2$) film 20 having the dishing shape on the protruding portion PP. That is, the following relation is satisfied between h2 and h1:

$$h2 > h1 \quad \text{Equation (1).}$$

In the process shown in FIG. 4, the slurry 53 corresponds to, for example, a second polishing agent.

Figure 5:
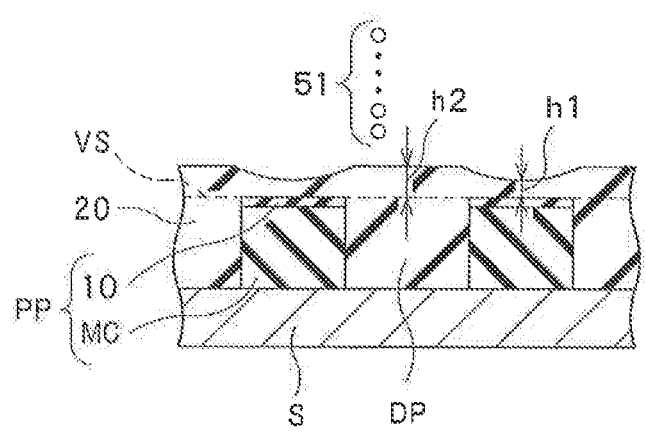

As shown in FIG. 5, the second CMP stopper film 30 on the depressed portion DP is then removed by CMP. In this instance, the slurry is changed from the slurry 53 including the interfacial active agent to a slurry including no interfacial active agent, for example, the cerium oxide slurry 51. As a result, the top surface of the silicon oxide ($SiO_2$) film 20 on the depressed portion DP becomes higher than the top surface of the silicon oxide ($SiO_2$) film 20 on the protruding portion PP.

Figure 6:
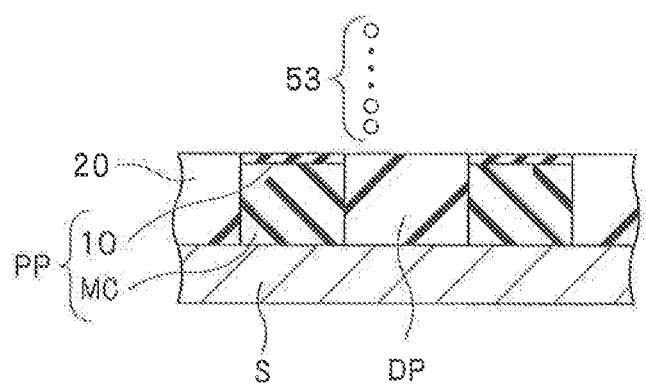

After the slurry has been changed from the cerium oxide slurry 51 to the slurry 53 including the interfacial active agent, the silicon oxide ($SiO_2$) film 20 is then removed by CMP until the CMP first stopper film 10 is exposed, as shown in FIG. 6. Similar to the process shown in FIG. 4, the interfacial active agent selectively adsorbs the CMP first stopper film 10, so that the silicon oxide ($SiO_2$) film 20 on the depressed portion DP is polished, the silicon oxide ($SiO_2$) film 20 on the protruding portion PP is selectively polished, and the CMP first stopper film 10 is protected.

As described above, the thickness of the silicon oxide ($SiO_2$) film 20 on the depressed portion DP is greater than the thickness of the silicon oxide ($SiO_2$) film 20 on the protruding portion PP (see Equation (1)), so that the dishing is unlikely to occur in the silicon oxide ($SiO_2$) film 20 on the depressed portion DP even if overpolishing occurs in the CMP step in FIG. 6. Thus, flatness is improved. In the present embodiment, for example, the flatness can be suppressed to 50 nm or less.

It is possible to flatten the silicon oxide ($SiO_2$) film 20 by using, for example, a ceria oxide slurry to which an interfacial active agent is added without using the second CMP stopper film 30 shown in FIG. 2.

However, when the silicon oxide ($SiO_2$) film 20 is formed on a large-area cell, long-time overpolishing is required to remove the silicon oxide ($SiO_2$) film 20 until the CMP first stopper film 10 is exposed. In this case, dishing occurs and progresses in the depressed portion DP, and flatness is likely to deteriorate to, for example, about 1 μm.

In contrast, according to the manufacturing method of the semiconductor device in at least one embodiment described above, the second CMP stopper film 30 is formed on the silicon oxide ($SiO_2$) film 20 in such a manner that the top surface of the silicon oxide ($SiO_2$) film 20 on the depressed portion DP may be higher than the top surface of the silicon oxide ($SiO_2$) film 20 on the protruding portion PP (see Equation (1)), and the second CMP stopper film 30 and the silicon oxide ($SiO_2$) film 20 are then sequentially removed. Therefore, it is possible to accurately flatten the silicon oxide ($SiO_2$) film 20 without occurrence of dishing in the depressed portion DP.

Moreover, according to the manufacturing method of the semiconductor device in at least one embodiment described above, flattening can be achieved by CMP alone without the use of etching that uses a photoresist along the way. Therefore, the number of processes is reduced accordingly, and low-cost flattening is possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions.

For example, although the silicon nitride (SiN) film is used as the second CMP stopper film 30, the second CMP stopper film 30 is not limited to this kind of film. For example, it is possible to use a silicon (Si) film, a silicon carbide (SiC) film, a carbon-doped silicon oxide (SiOC) film, a silicon oxynitride (SiON) film, or a silicon carbonitride (SiCN) film. It is also possible to use tungsten (W) or its nitride or carbide.

In addition, though the cerium oxide slurry is used as the slurry in the case described according to the above embodiment, the slurry is not limited to this kind of slurry. For example, a silica slurry or an alumina slurry may be used.

The accompanying claims and their equivalents are intended to cover such forms or modifications as would fall within the scope and spirit of the inventions.

The invention claimed is:
1. A manufacturing method of a semiconductor device comprising:
    forming, on a substrate, protruding portions comprising first films respectively provided on the surfaces thereof;
    forming a second film different from the first films so as to fill a depressed portion between the protruding portions and to cover the protruding portions;
    processing in such a manner that the top surface of the second film on the depressed portion is higher than the top surface of the second film on the protruding portions after forming the second film to cover the protruding portions; and
    polishing the second film on the depressed and protruding portions to expose the first films, wherein processing in such a manner that the top surface of the second film on the depressed portion is higher than the top surface of the second film on the protruding portions comprises:
covering the second film on the depressed portion and the protruding portions with a third film,
exposing the surface of the second film on the protruding portions after polishing the third film on the protruding portions,
polishing and removing the exposed second film on the protruding portions,
removing the third film covering the second film on the depressed portion after polishing and removing the exposed second film on the protruding portions, and
after removing the third film covering the second film on the depressed portion, exposing the first film on the protruding portion.

2. The method of claim 1,
wherein the second film is polished by use of a slurry containing an ammonium salt.

3. The method of claim 2,
wherein the third film comprises a SiN film, and the ammonium salt comprises polycarboxylic acid ammonium salt.

4. The method of claim 1,
wherein the third film is removed by use of a slurry containing no ammonium salt.

5. The method of claim 1,
wherein the third film comprises one of films selected from the group consisting of a silicon (Si) film, a silicon carbide (SiC) film, a carbon-doped silicon oxide (SiOC) film, a silicon oxynitride (SiON) film, and a silicon carbonitride (SiCN) film.

6. The method of claim 1,
wherein the second film comprises an SiO2 film.

7. The method of claim 1,
wherein a first slurry used in the polishing process of the third film on the protruding portions is different from a second slurry used in the polishing process of the exposed second film on the protruding portions.

8. The method of claim 1,
wherein a first slurry is used in the removing process of the third film covering the second film on the depressed portion, and
a second slurry is used in the removing process of the exposed second film on the protruding portions.

9. The method of claim 7,
wherein the first slurry is used in the removing process of the third film covering the second film on the depressed portion, and
the second slurry is used in the removing process of the exposed second film on the protruding portions.

10. The method of claim 1,
wherein the surface of the second film on the protruding portions is exposed by polishing the third film on the protruding portions, but not by pattering it.

* * * * *